United States Patent
Ko

(10) Patent No.: US 6,420,780 B1
(45) Date of Patent: Jul. 16, 2002

(54) VOLTAGE REGULATOR

(75) Inventor: Young-Keun Ko, Kyungbuk (KR)

(73) Assignee: Auk Co., Ltd., Chonbuk (KR)

( * ) Notice: Subject to any disclaimer, the term of this patent is extended or adjusted under 35 U.S.C. 154(b) by 0 days.

(21) Appl. No.: 09/475,022

(22) Filed: Dec. 30, 1999

(30) Foreign Application Priority Data

May 28, 1999 (KR) .......................................... 1999/9279

(51) Int. Cl.⁷ .............................................. H01L 23/48
(52) U.S. Cl. ........................ 257/666; 257/666; 257/723
(58) Field of Search .......................... 257/48, 723, 724, 257/666, 692

(56) References Cited

U.S. PATENT DOCUMENTS 5,864,173 A * 1/1999 Fogelson ..................... 257/666
5,998,856 A * 12/1999 Noda et al. .................. 257/666
6,198,136 B1 * 3/2001 Voldman et al. ............ 257/357

* cited by examiner

Primary Examiner—Jerome Jackson, Jr.
Assistant Examiner—Lourdes Cruz
(74) Attorney, Agent, or Firm—Lowe Hauptman Gilman & Berner, LLP

(57) ABSTRACT

According to a voltage regulator of the present device, a drive IC and an output transistor are formed separately, and the drive IC is mounted on the ground lead and connected electrically to an input lead. The output transistor is mounted on an output lead and connected to the drive IC and to the input lead. As such, the leads, the drive IC and the output transistor are arranged as a package so that the regulator can accomodate various output voltage or current, and it is not necessary to specially make a number of drive ICs which have different output current levels respectively so that the number of masks is reduced. Due to the fact that the output transistor is separated from the drive IC, the size of the drive IC chip is made smaller, thereby reducing the manufacturing costs.

3 Claims, 1 Drawing Sheet

VOLTAGE REGULATOR

TECHNICAL FIELD OF THE DEVICE

The present device relates to a semiconductor component, or more particularly to a structure of a voltage regulator which can implement an output current of a desired output level by a change of only an output transistor without a necessity of making a new mask for the IC.

BACKGROUND ART

In general, a photo-masking process in the semiconductor manufacturing process, an important field in the semiconductor manufacturing process, is a technique for selectively removing the uppermost layer of a wafer or for forming a pattern. The photo masking process is also used in the case of forming a voltage regulator chip. In other words, the operation of laying out the mask with formation of a pattern onto the surface of a wafer and radiating the same with the light source is repeated. The repeated operations are different according to the types of chips. For the voltage regulator, about 7 to 10 masks are used sequentially.

The voltage regulator has a function of keeping an output voltage constant even when an input voltage and an output current are changed, wherein a drive IC and an output transistor, etc are included in a chip.

FIG. 2 is a drawing for showing a structure of a conventional voltage regulator. A plural of lead frames 51, 53, 55 for outputting the voltage, for grounding and for inputting the voltage (or the current) respectively are shown in the Figure, and a chip 57 is mounted on the lead frame 51 for the output of the voltage. The chip 57 is formed as an one-chip form where the drive IC and the output transistor are laid out in one chip. The chip 57 can be connected electrically, if necessary, to the lead frames 53, 55 laid out adjacently. Also, the chip 57 and the lead frames 51, 53, 55 are molded as a package 59.

According to the one-chip form voltage regulator constructed as above, the input voltage is inputted to the lead frame 55 for an input operation, and a constant voltage is outputted through the lead frame 51 for an output operation by operations of the drive IC and the output transistor.

In the conventional one-chip form voltage regulator, all the masks must be separately produced in the IC manufacture process in the case for varying the level of the output current. Accordingly, when an IC is made with the varying output current, a new mask must be made according to the corresponding output current, thereby increasing the manufacture costs.

SUMMARY OF THE DEVICE

For solving the problem mentioned above, the present device provides a voltage regulator, wherein the existing masks can be used unchanged even in case of changing the output current of the voltage regulator, and the chips are made in smaller size to be mounted on the lead frames of a smaller area, thereby reducing the manufacturing costs.

To accomplish the object of the present device mentioned above, the voltage regulator comprises a lead frame comprising a multiple of leads, a drive IC mounted on the lead frame, and an output transistor which is formed as a separate chip from the drive IC and is connected electrically to the drive IC, said output transistor being mounted on the lead frame to determine the load current.

DETAILED DESCRIPTION OF THE EXEMPLARY EMBODIMENTS

Hereinafter, an preferred embodiment of the present device will be explained in detail with respect to the accompanying drawings.

Figure 1:
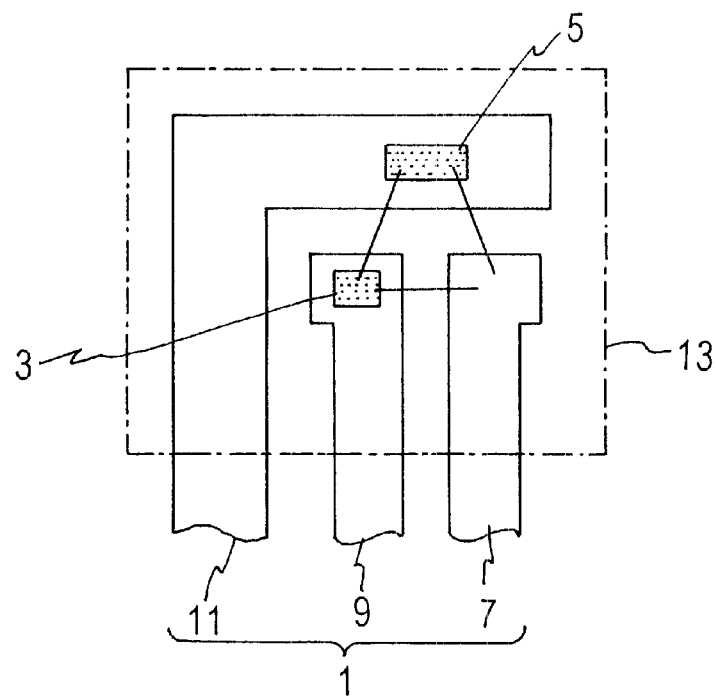
FIG. 1 is a drawing for showing a structure of a voltage regulator according to an embodiment of the present device.
Figure 2:
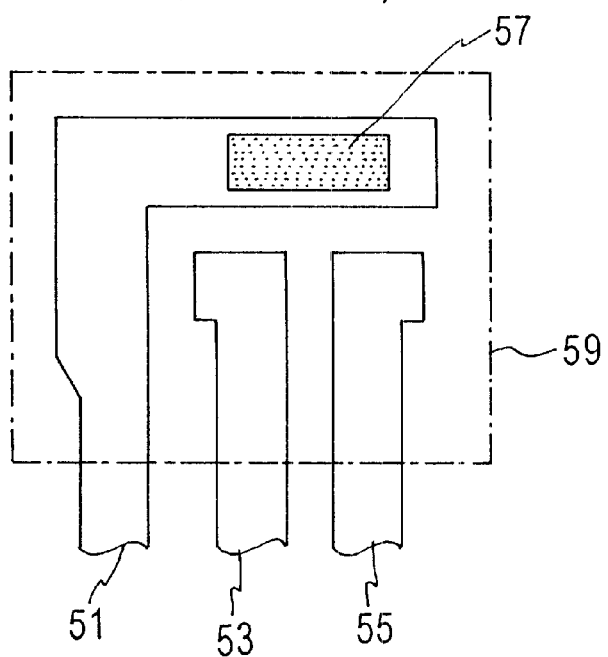
FIG. 2 is a drawing for showing a structure of a conventional voltage regulator.

FIG. 1 is a drawing for showing the structure of the voltage regulator wherein a lead frame 1, a drive IC 3 mounted on the lead frame 1, and an output transistor 5 mounted on the lead frame 1 are shown, the output transistor being formed as a separate chip from the drive IC 3 and being connected electrically to the drive IC.

The lead frame 1 comprises an input lead 7 to which the voltage or the current is inputted, a ground lead 9 disposed on one side of the input lead 7, and an output lead 11 disposed on one side of the lead for grounding 9 to output the voltage or the current. The lead frame 1 can be designed in a different form according to the characteristics of the chips or the level of the output current.

The drive IC 3 is mounted on the lead for grounding 9 and is connected electrically to the input lead 7. Also, the output transistor 5 is mounted on the output lead 11 to determine the load current and is connected electrically to the drive IC 3 and the input lead 7. The lead frame 1, the drive IC and the output transistor 5 constitutes a package 13.

In the voltage regulator formed as above, the voltage or the current is inputted through the input lead 7 and then the output voltage is constantly outputted by operations of the drive IC 3 and the output transistor 5.

With respect to the voltage regulator, a process of using a mask is applied for making only the drive IC 3 which is included in a package with the output transistor which is replaced appropriately according to the output level. So, it is possible to use only one mask in order to make the drive IC 3.

In addition, the drive IC 3 and the output transistor 5 are formed as separate chips to reduce the size of the chip of the drive IC 3.

According to the voltage regulator of the present device, the drive IC and the output transistor are made as separate chips in a package to be suitable for various output voltage or current. Accordingly, it is not necessary to specially make a number of drive ICs which have the different output current levels respectively so that the number of masks is reduced, and the output transistor is separate from the drive IC for reducing the size of the drive IC chip and the manufacturing costs.

What is claimed is:

1. A voltage regulator comprising
    a lead frame including multiple leads;
    a drive IC on a first chip mounted so the entire area of the first chip is on a first of the leads of the lead frame; and
    an output transistor on a second chip mounted so the entire area of the second chip is on a second lead of the lead frame, said output transistor being connected electrically to the drive IC and being arranged for determining output current of the voltage regulator that is supplied by the second lead to a load adapted to be connected to the second lead.

2. A voltage regulator according to claim 1, wherein said lead frame comprises
    a third lead for supplying an input to the regulator;
    the first lead being a ground lead, the third lead being laid out on one side of the first lead, and connected electrically to the first lead; and
    the second lead being an output lead for outputting the regulator output voltage, the second lead being laid out on one side of the lead for grounding and connected electrically to the input lead and to the lead for grounding.

3. A voltage regulator comprising an input lead for inputting electric power having a voltage to be regulated;

a ground lead for grounding, laid out on one side of the input lead;

a drive IC on a first chip mounted so the entire area of the first chip is on the lead for grounding and connected electrically to the input lead;

an output lead laid out on one side of the input lead and the ground lead; and an output transistor on a second chip mounted so the entire area of the second chip is on the output lead, said output transistor being connected electrically to the drive IC and to the input lead for determining the output current of the voltage regulator that is supplied by the output lead to a load adapted to be connected to the output lead.

* * * * *